United States Patent
Doi et al.

(10) Patent No.: US 9,666,331 B2
(45) Date of Patent: May 30, 2017

(54) FERROELECTRIC THIN FILM-FORMING SOL-GEL SOLUTION

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 242 days.

(21) Appl. No.: 14/181,394

(22) Filed: Feb. 14, 2014

(65) Prior Publication Data

US 2014/0288219 A1  Sep. 25, 2014

(30) Foreign Application Priority Data

Mar. 19, 2013 (JP) ................. 2013-056229

(51) Int. Cl.

| H01L 41/318 | (2013.01) |
|---|---|
| H01L 41/187 | (2006.01) |
| H01L 41/09 | (2006.01) |
| C08K 5/52 | (2006.01) |
| H01B 3/44 | (2006.01) |
| C23C 18/12 | (2006.01) |

(52) U.S. Cl.
CPC ......... *H01B 3/448* (2013.01); *C23C 18/1216* (2013.01); *C23C 18/1254* (2013.01); *C23C 18/1291* (2013.01); *H01L 41/318* (2013.01); *C23C 18/1225* (2013.01); *H01L 41/0973* (2013.01); *H01L 41/1876* (2013.01)

(58) Field of Classification Search
USPC ......................................................... 524/104
See application file for complete search history.

(56) References Cited

U.S. PATENT DOCUMENTS

| 2004/0129918 A1 | 7/2004 | Eritate et al. |
| 2004/0132221 A1 | 7/2004 | Kobayashi et al. |
| 2013/0022839 A1 | 1/2013 | Kijima et al. |

FOREIGN PATENT DOCUMENTS

| CN | 1588130 A | 3/2005 |
| EP | 2644743 A2 | 10/2013 |
| JP | 2001-261338 A | 9/2001 |
| JP | 2001-521976 A | 11/2001 |
| JP | 2002-047011 A | 2/2002 |
| JP | 2002-293623 A | 10/2002 |
| JP | 2004-107179 A | 4/2004 |
| JP | 2004-107181 A | 4/2004 |
| JP | 2008-214185 A | 9/2008 |
| JP | 2010-215909 A | 9/2010 |
| WO | WO-99/23181 A1 | 5/1999 |

OTHER PUBLICATIONS

Yamano Akihiro et al: "Ferroelectric domain structures of 0.4-μm-thick Pb(Zr,Ti) $O_3$ films prepared by polyvinylpyrrolidone-assisted Sol-Gel method", Journal of Applied Physics, American Institute of Physics, US, vol. 111, No. 5, Mar. 14, 2012, pp. 54109-1 to 54109-5.
Search Report dated Jun. 26, 2014, issued for the European patent application No. 14155330.5.
Akihiro Yamano et al., "Single-step sol-gel deposition and dielectric properties of 0.4 μm thick, (001) oriented Pb(Zr, Ti)$O_3$ this films," J Sol-Gel Sci. Technol (2008), vol. 47, pp. 316-325.
Notice of Reasons for Rejection, issued in corresponding Japanese Patent Application No. JP 2013-056229, dated Jul. 19, 2016.
Notification of the First Office Action, issued in corresponding Chinese Patent Application No. CN 201410054822.8, dated Nov. 4, 2016.

*Primary Examiner* — Ling Choi
*Assistant Examiner* — Thuy-Al N Nguyen
(74) *Attorney, Agent, or Firm* — Locke Lord LLP; James E. Armstrong, IV; Nicholas J. DiCeglie, Jr.

(57) ABSTRACT

This ferroelectric thin film-forming sol-gel solution contains: a PZT-based compound; a high-molecular compound used to adjust the viscosity containing polyvinyl pyrrolidone; and an organic dopant containing N-methyl pyrrolidone, in which the amount of the PZT-based compound is greater than or equal to 17 mass % in terms of oxides, the molar ratio (PZT-based compound:polyvinyl pyrrolidone) of the polyvinyl pyrrolidone to the PZT-based compound is 1:0.1 to 1:0.5 in terms of monomers, and the amount of the organic dopant containing N-methyl pyrrolidone in the sol-gel solution is 3 mass % to 13 mass %.

4 Claims, No Drawings

US 9,666,331 B2

FERROELECTRIC THIN FILM-FORMING SOL-GEL SOLUTION

BACKGROUND OF THE INVENTION

Field of the Invention

The present invention relates to a ferroelectric thin film-forming sol-gel solution. Specifically, the invention relates to a ferroelectric thin film-forming sol-gel solution capable of obtaining a crack-free and dense ferroelectric thin film after pre-baking and baking when a single layer thereof having a thickness of greater than several hundreds of nanometers is formed by coating a ferroelectric thin film-forming sol-gel solution once using a chemical solution deposition (CSD) method.

Priority is claimed on Japanese Patent Application No. 2013-056229, filed on Mar. 19, 2013, the amount of which is incorporated herein by reference.

Description of Related Art

In the related art, in a case where a PZT-based ferroelectric thin film (hereinafter, abbreviated as "PZT film") is formed on a substrate using a CSD method such as a sol-gel method, when a single layer of the film is formed in each coating process using a PZT-based ferroelectric thin film-forming sol-gel solution (hereinafter, abbreviated as "sol-gel solution"), the thickness of the single layer is limited to about 100 nm. The reason is that, when a film having a thickness of greater than 100 nm is pre-baked and baked, tensile stress generated in a PZT film is non-uniform in the same film, and thus cracking frequently occurs in the same film. Accordingly, currently, in order to obtain a PZT film having a thickness of several micrometers, it is necessary that the thickness of a single layer be further decreased and that pre-baking and baking be repeated while performing a coating process several tens of times. However, with such a method, production efficiency decreases, which leads to an increase in film forming cost.

In order to solve the above-described problem, disclosed is a sol-gel solution capable of obtaining a thick film of which a single layer having a thickness of 200 nm or greater is formed in each coating process of the sol-gel solution by using propylene glycol as an organic solvent for preparing the sol-gel solution (for example, refer to Japanese Unexamined Patent Application, First Publication No. 2001-261338 (claim 1, paragraphs [0016] to [0024], and Table 1)). In addition, disclosed is a method capable of forming a thick single layer in each coating process of a sol-gel solution, in which a high-molecular compound is added to a high-concentration sol-gel solution to release tensile stress generated during film formation (for example, refer to J Sol-Gel Sci Technol (2008) 47:316 to 325)

In addition, Published Japanese Translation No. 2001-521976 of the PCT International Publication discloses a configuration in which N-methyl pyrrolidone is used as a solvent of an ink composition for ink jet printing, the solvent dispersing a core-shell polymer binder and ferrite powder (for example, refer to paragraphs [0013] and [0188]). However, the composition disclosed in Published Japanese Translation No. 2001-521976 of the PCT International Publication is a composition for ink jet printing, and smearing resistance is improved by the core-shell polymer binder. That is, the object and the configuration of this composition are completely different from those of a sol-gel solution according to the invention described below. Further, the composition disclosed in Published Japanese Translation No. 2001-521976 of the PCT International Publication is a composition formed of a dispersion obtained by dispersing ferrite powder in a solvent, and the configuration thereof is completely different from that of a composition formed of the sol-gel solution according to the invention in which a metal alkoxide and the like are used as raw materials.

SUMMARY OF THE INVENTION

The present inventors found that it is difficult to form a PZT film having a crack-free and dense structure and having practically sufficient properties by using the above-described sol-gel solutions disclosed in the related art.

An object of the invention is to provide a PZT-based ferroelectric thin film-forming sol-gel solution capable of forming a crack-free and dense PZT film after pre-baking and baking even when a single layer thereof having a thickness of greater than several hundreds of nanometers is formed in each coating process of the sol-gel solution.

According to a first aspect of the invention, there is provided a ferroelectric thin film-forming sol-gel solution containing: a PZT-based compound; a high-molecular compound used to adjust viscosity containing polyvinyl pyrrolidone; and an organic dopant containing N-methyl pyrrolidone, in which the amount of the PZT-based compound is greater than or equal to 17 mass % in terms of oxides, a molar ratio of the PZT-based compound:the polyvinyl pyrrolidone is 1:0.1 to 1:0.5 in terms of monomers, and the amount of N-methyl pyrrolidone is 3 mass % to 13 mass % in the sol-gel solution.

According to a second aspect of the invention, in the ferroelectric thin film-forming sol-gel solution according to the first aspect, it is preferable that a k value of the polyvinyl pyrrolidone is in a range of 15 to 90.

"k value" described herein refers to a value representing a viscosity property, which correlates to a molecular weight, and is calculated according to the following Fikentscher's formula using a relative viscosity (25° C.) which is measured with a capillary viscometer.

$$k \text{ value} = (1.5 \log \eta_{rel} - 1)/(0.15 + 0.003c) + (300c \log \eta_{rel} + (c + 1.5c \log \eta_{rel})^2)^{1/2}/(0.15c + 0.003c^2)$$

($\eta_{rel}$: relative viscosity (25° C.) of aqueous polyvinyl pyrrolidone solution to water, c: concentration (wt %) of polyvinyl pyrrolidone in aqueous polyvinyl pyrrolidone solution)

According to a third aspect of the present invention, there is provided a method of forming a ferroelectric thin film using the ferroelectric thin film-forming sol-gel solution according to the first or second aspect.

The ferroelectric thin film-forming sol-gel solution according to the first aspect contains: a PZT-based compound; a high-molecular compound used to adjust the viscosity containing polyvinyl pyrrolidone; an organic dopant containing N-methyl pyrrolidone, which is a polar solvent.

In this configuration, a amount of the PZT-based compound is greater than or equal to 17 mass % in terms of oxides, a molar ratio of the PZT-based compound:the polyvinyl pyrrolidone is 1:0.1 to 1:0.5 in terms of monomers, and a amount of N-methyl pyrrolidone is 3 mass % to 13 mass %. With the configuration of the sol-gel solution according to the invention, an appropriate gap is formed in a film during drying, and thus gas or the like produced by decomposition can be efficiently removed from the film. For the above-described reason, when the sol-gel solution is used to prepare a PZT-based ferroelectric thin-film, a PZT film having a crack-free and dense structure and practically sufficient properties can be prepared.

According to the second aspect, in the ferroelectric thin film-forming sol-gel solution according to the first aspect, a k value of the polyvinyl pyrrolidone is controlled to be in a range of 15 to 90. Therefore, when the sol-gel solution is used to prepare a PZT-based ferroelectric thin-film, a more preferable PZT film having a crack-free and dense structure and practically sufficient properties can be prepared.

In the method of forming a ferroelectric thin film according to the third aspect, a more preferable PZT film having a crack-free and dense structure and practically sufficient properties can be prepared.

DETAILED DESCRIPTION OF THE INVENTION

A ferroelectric thin film-forming sol-gel solution according to an embodiment of the invention will be described below using a PZT-based ferroelectric thin film-forming sol-gel solution (hereinafter, abbreviated as "PZT sol-gel solution) as a representative example.

The PZT sol-gel solution according to the embodiment contains: a PZT-based compound; a high-molecular compound used to adjust the viscosity containing polyvinyl pyrrolidone (PVP); and an organic dopant containing N-methyl pyrrolidone, in which the amount of the PZT-based compound is greater than or equal to 17 mass % in terms of oxides, a molar ratio of the PZT-based compound: the polyvinyl pyrrolidone is 1:0.1 to 1:0.5 in terms of monomers, and the amount of N-methyl pyrrolidone is 3 mass % to 13 mass % in the sol-gel solution.

First, as base components of the PZT sol-gel solution according to the embodiment, the PZT-based compound, the high-molecular compound used to adjust the viscosity containing polyvinyl pyrrolidone, and the organic dopant containing N-methyl pyrrolidone will be described.

The PZT-based compound includes compounds aside from PZT such as PLZT, PMnZT, or PNbZT. As a material of the PZT-based compound, a compound in which an organic group binds to each metal element of Pb, La, Zr, and Ti through an oxygen or nitrogen atom of the organic group is preferable. Examples of such a compound include one or two or more elements selected from the group consisting of metal alkoxides, metal diol complexes, metal triol complexes, metal carboxylates, metal β-diketonate complexes, metal β-diketoester complexes, metal β-iminoketo complexes, and metal amino complexes. Particularly preferable compounds are metal alkoxides, and partial hydrolysates and organic acid salts thereof.

Specifically, examples of a Pb compound and a La compound include acetates (lead acetate: $Pb(OAc)_2$, lanthanum acetate: $La(OAc)_3$), lead diisopropoxide: $Pb(OiPr)_2$, and lanthanum triisopropoxide: $La(OiPr)_3$. Examples of a Ti compound include alkoxides such as titanium tetraethoxide: $Ti(OEt)_4$, titanium tetraisopropoxide: $Ti(OiPr)_4$, titanium tetra n-butoxide: $Ti(OiBu)_4$, titanium tetraisobutoxide: $Ti(OiBu)_4$, titanium tetra t-butoxide: $Ti(OtBu)_4$, or titanium dimethoxy diisopropoxide: $Ti(OMe)_2(OiPr)_2$. As a Zr compound, the same alkoxides as those of the Ti compound are preferable. Metal alkoxides may be used without any change, and partial hydrolysates thereof may be used in order to promote decomposition.

The PZT-based compound in the PZT sol-gel solution is obtained from the above-described raw materials using a method of preparing a raw material solution (described below) of the PZT sol-gel solution containing the PZT-based compound.

In the high-molecular compound used to adjust the viscosity containing polyvinyl pyrrolidone, polyvinyl pyrrolidone (PVP) is a compound capable of adjusting the viscosity of the solution. More specifically, a relative viscosity can be determined and adjusted based on the above-described k value ("k value" described herein refers to a value representing a viscosity property, which correlates to a molecular weight, and is calculated according to the following Fikentscher's formula using a relative viscosity (25° C.) which is measured with a capillary viscometer).

$$k\ value=(1.5\ \log\ \eta rel-1)/(0.15+0.003c)+(300c\ \log\ \eta rel+(c+1.5c\ \log\ \eta rel)^2)^{1/2}/(0.15c+0.003c^2)$$

In the above formula, "ηrel" represents a relative viscosity (25° C.) of an aqueous polyvinyl pyrrolidone solution to water, and "c" represents a concentration (wt %) of polyvinyl pyrrolidone in an aqueous polyvinyl pyrrolidone solution.

In the embodiment, polyvinyl pyrrolidone having a k value in a range of 15 to 90 is preferable. When the k value is less than 15, the viscosity is not sufficient for obtaining a thick film, which causes a problem. When the k value is greater than 90, the viscosity is excessively high, which causes a problem of non-uniform coating. The k value is in a range of more preferably 30 to 45.

In addition, as the high-molecular compound, polyethylene glycol which has a polymerization degree of 100 to 1000 is preferably used. When the polymerization degree is lower than 100, a sufficient viscosity is not obtained, which causes a problem. When the polymerization degree is higher than 1000, the viscosity is excessively high, which causes a problem of non-uniform coating.

The amount of polyvinyl pyrrolidone with respect to 100 mass % of the high-molecular compound is preferably 50 mass % to 100 mass % and more preferably 80 mass % to 100 mass %.

By using the organic dopant containing N-methyl pyrrolidone in combination with the high-molecular compound containing polyvinyl pyrrolidone, it is possible to achieve the object of the invention, that is, to provide a PZT sol-gel solution capable of forming a crack-free and dense PZT film after pre-baking and baking even when a single layer thereof having a thickness of greater than several hundreds of nanometers is formed in each coating process of the sol-gel solution.

It is preferable that the organic dopant further contain an ethanolamine such as monoethanolamine or diethanolamine. This ethanolamine has an effect of increasing the storage stability of the solution by being coordinated to a metal alkoxide.

The amount of N-methyl pyrrolidone with respect to 100 mass % of the organic dopant is preferably 80 mass % to 100 mass % and more preferably 90 mass % to 100 mass %. Meanwhile, the amount of an ethanolamine with respect to 100 mass % of the organic dopant is preferably 0 mass % to 30 mass % and more preferably 0 mass % to 20 mass %.

Next, the formulae of the base components in the PZT sol-gel solution will be described.

First, the amount of the PZT-based compound in the PZT sol-gel solution is controlled to be greater than or equal to 17 mass % in terms of oxides. The reason is that, when the amount of the PZT-based compound is less than 17 mass %, the concentration of a precursor is low, which causes a problem that a film having a sufficient thickness is not obtained. The amount of the PZT-based compound is preferably less than or equal to 23 mass %. The reason is that, when the amount of the PZT-based compound is greater than 23 mass %, the ratio of a lower alcohol as a diluent is decreased, which may cause deterioration in coating properties and storage stability.

The amount of the PZT compound in the PZT sol-gel solution is more preferably 17 mass % to 28 mass %.

"In terms of oxides" described herein represents "an amount ration of a metallic oxide with respect to 100 mass % of PZT sol-gel solution" when all metallic elements in the PZT sol-gel solution supposed to be changed into oxide.

Next, the molar ratio of the PZT-based compound:the polyvinyl pyrrolidone in terms of monomers is controlled to be 1:0.1 to 1:0.5.

"In terms of monomers" described herein represents a converted value wherein the molar weight of polymer is converted to the converted value by using the molar weight of monomers (based on 1 mol) which compose a polymer".

The reason is as follows. When the molar ratio is lower than 1:0.1, a sufficient viscosity is not obtained, and stress is not released, which causes a problem of cracking. When the molar ratio is higher than 1:0.5, there is a problem that a number of voids are formed in a film. The molar ratio (PZT-based compound:polyvinyl pyrrolidone) is more preferably 1:0.2 to 1:0.45. The reason is as follows. When the molar ratio is lower than 1:02, the width of a process temperature range is narrow, which causes a problem that cracking is likely to occur. When the molar ratio is higher than 1:0.45, there is a problem that a small number of voids may be formed.

The amount of the N-methyl pyrrolidone is controlled to be 3 mass % to 13 mass % with respect to 100 mass % of the PZT-based sol-gel solution. The reason is as follows. When the amount of the organic dopant is less than 3 mass %, the addition amount is not sufficient, which causes a problem that cracking cannot be suppressed. When the amount of the organic dopant is greater than 13 mass %, the solution is completely diluted, which causes a problem that the thickness of a coating film for each layer is small. The amount of the organic dopant is more preferably 6.5 mass % to 10 mass %. The reason is as follows. When the amount of the organic amount is less than 6.5 mass %, there is a problem that cracking is likely to occur. When the amount of the organic amount is greater than 10 mass %, there is a problem that the thickness of a coating film for each layer is small.

Further, according to the base components and the formulae, a method of preparing a raw material solution of the PZT sol-gel solution containing the PZT-based compound will be described.

The raw material solution of the PZT sol-gel solution is prepared according to the following liquid synthesis flow. First, as Zr source, a Ti source, and a stabilizer are added to a reaction vessel, followed by reflux in a nitrogen atmosphere. Next, a Pb source is added to the compound after reflux, and a solvent is added thereto, followed by reflux in a nitrogen atmosphere. After a by-product is removed by distillation under reduced pressure, propylene glycol is further added to this solution to adjust the concentration, and ethanol is further added to this solution. More typically, $Pb(CH_3COO)_3 \cdot 3H_2O$, $Zr(Oi\text{-}Pr)_4$, and $Ti(Oi\text{-}Pr)_4$ are weighed and prepared in predetermined weights and added to the solution such that a composition ratio Pb/Zr/Ti of the PZT-based compound is 115/52/48 (17 mass % or greater in terms of oxides). The mixture is dissolved in a solvent such as ethanol to obtain a raw material solution. Optionally, a stabilizer is added to the raw material solution, and this addition will be described below.

The composition ratio Pb/Zr/Ti of the PZT-based compound can be appropriately changed depending on the desired composition of the PZT-based compound.

Next, the addition and the mixing of additives contained in the raw material solution will be described.

In the PZT sol-gel solution according to the embodiment, the high-molecular compound used to adjust the viscosity containing polyvinyl pyrrolidone is added to the above-obtained raw material solution such that the molar ratio (PZT-based compound:polyvinyl pyrrolidone) is 1:0.1 to 1:0.5 in terms of monomers. The technical ground of the molar ratio is as described above. After adding polyvinyl pyrrolidone to the raw material solution at the above-described molar ratio, the solution is stirred at room temperature for 24 hours. The N-methyl pyrrolidone is added to the raw material solution such that the concentration thereof in the PZT-based sol-gel solution is 3 mass % to 13 mass %, followed by stirring for 2 hours and stabilization at room temperature for 24 hours.

In addition, a stabilizer to be added and a solvent to be used are as follows. A stabilizer may be optionally added to the PZT-based sol-gel solution at a ratio (number of molecules of stabilizer)/(number of metal atoms) of about 0.2 to 3. Examples of the stabilizer include β-diketones (such as acetyl acetone, heptafluorobutanoyl pivaloyl methane, dipivaloyl methane, trifluoroacetyl acetone, or benzoyl acetone), β-ketonic acids (such as acetoacetic acid, propionyl acetic acid, or benzoyl acetic acid), β-keto esters (such as methyl, propyl, butyl, and other lower alkyl esters of the above-described ketonic acids), oxy acids (such as lactic acid, glycolic acid, α-oxybutyric acid, or salicylic acid), lower alkyl esters of the above-described oxy acids, oxyketones (such as diacetone alcohol or acetoin), diols, triols, higher carboxylic acids, alkanol amines (such as diethanolamine, triethanolamine, or monoethanolamine), and polyvalent amines.

As the solvent used in the embodiment, ethanol may be used. However, the solvent used in the embodiment is appropriately determined according to the raw materials to be used. Typically, carboxylic acids, alcohols (for example, propylene glycol as a polyol), esters, ketones (such as acetone or methyl ethyl ketone), ethers (such as dimethylether or diethylether), cycloalkanes (such as cyclohexane or cyclohexanol), aromatic compounds (such as benzene, toluene, or xylene) or tetrahydrofuran; or mixed solvents of two or more of the above-described solvents can be used.

The amount of the solvent which can be added with respect to 100 mass % of the PZT-based sol-gel solution is 50 mass % to 70 mass % and more preferably 60 mass % to 65 mass %.

Preferable examples of the carboxylic acids include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

In addition, preferable examples of the esters include ethyl acetate, propyl acetate, n-butyl acetate, sec-butyl acetate, tert-butyl acetate, isobutyl acetate, n-amyl acetate, sec-amyl acetate, tert-amyl acetate, and isoamyl acetate. Preferable examples of the alcohols include 1-propanol, 2-propanol, 1-butanol, 2-butanol, isobutyl alcohol, 1-pentanol, 2-pentanol, 2-methyl-2-pentanol, and 2-methoxyethanol.

In addition, the PZT sol-gel solution may contain 10 mass % to 20 mass % of a β-diketone or a polyol with respect to 100 mass % of the PZT-based sol-gel solution. Among these, acetyl acetone is preferable as the β-diketone, and propylene glycol is preferable as the polyol.

The PZT sol-gel solution prepared as above is coated on a substrate using a chemical solution deposition (CSD) method such as a spin coating method, a dip coating method, or a liquid source misted chemical deposition (LSMCD) method, and the residual solvent, water, and the like are removed therefrom at a predetermined temperature for a predetermined time to obtain a gel film, followed by pre-baking and baking. As a result, a PZT-based ferroelectric thin film is prepared.

According to the PZT sol-gel solution of the embodiment, the viscosity can be increased by the addition of the high-molecular compound, and cracking can be suppressed by the addition of N-methyl pyrrolidone. For example, a relatively thick film of which a single layer having a thickness of 100 nm or greater is formed in each spin coating process can be formed, and a PZT film after pre-baking and baking can be made to have a crack-free and dense structure and sufficiently high ferroelectric properties. As a result, production efficiency can be improved.

EXAMPLES

Next, Examples of the invention and Comparative Examples will be described in detail.

A comparative test and an evaluation were performed as follows.

Regarding PZT films obtained in Examples 1 to 6 and Comparative Examples 1 and 2, the thicknesses and the refractive indices of the thin films after baking were obtained with the following methods. The results are shown in Table 1. In addition, cross-sections and surfaces of the PZT films obtained in Examples 1 and 4 and Comparative Example 2 were observed.

(1) Thickness measurement: The thicknesses of the obtained PZT films were measured using a spectroscopic ellipsometer (M-2000, manufactured by J. A. Woollam Co. Inc.), and the measurement results thereof were shown in Table 1.

(2) Refractive index measurement: The refractive indices of the obtained PZT films were measured using a spectroscopic ellipsometer (M-2000, manufactured by J. A. Woollam Co. Inc.), and the measurement results thereof were shown in Table 1.

(3) Cross-section observation: Cross-sections of the obtained PZT films were observed using images (magnification: 100000 times) which were imaged by an SEM (S-4300SE, manufactured by Hitachi Ltd.), to check whether cracking occurred or not.

(4) Surface observation: Surfaces of the obtained PZT films were observed using images (magnification: 25000 times) which were imaged by an SEM (S-4300SE, manufactured by Hitachi Ltd.), to check whether cracking occurred or not.

Example 1

0.73 g of polyvinyl pyrrolidone (hereinafter, referred to as "PVP"; k=30) was added to 50 g of the PZT sol-gel solution in which 25 wt % of PZT as an oxide was dissolved in an ethanol solvent such that PZT:PVP=1:0.2, followed by stirring for 2 hours and stabilization in a refrigerator (5° C.) for 24 hours. N-methyl pyrrolidone was added to the above-obtained solution such that the amount thereof in the solution was 6.5 mass %, followed by stirring for 2 hours. The obtained solution was added dropwise to a Pt film of a substrate in which a $SiO_2$ film, a $TiO_2$ film, and a Pt film were formed on a Si substrate in this order (hereinafter, referred to as "Pt/$TiO_x$/$SiO_2$/Si substrate, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained film was 2.40 when measured at 632.8 nm. This substrate was baked by being heated to 700° C. at a temperature increase rate of 10° C./sec and being held at 700° C. for 1 minute in RTA. The refractive index of the obtained PZT film was 2.52 when measured at this time. A Pt upper electrode (200 nm) was formed on the obtained PZT film by sputtering. When electrical properties of the PZT film were measured, a dielectric constant at 0 V was 1500, and it was able to be confirmed that the PZT film had a high dielectric constant. In addition, when observed using a SEM, the PZT film had a thickness of 250 nm and a dense structure, and cracking did not occur.

Example 2

0.91 g of PVP (k=30) was added to 50 g of the PZT sol-gel solution in which 25 wt % of PZT as an oxide was dissolved in an ethanol solvent such that PZT:PVP=1:0.25, followed by stirring for 2 hours and stabilization in a refrigerator (5° C.) for 24 hours. N-methyl pyrrolidone was added to the above-obtained solution such that the amount thereof in the solution was 3.0 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.40 when measured at 632.8 nm. This substrate was baked by being heated to 700° C. at a temperature increase rate of 10° C./sec and being held at 700° C. for 1 minute in RTA. The refractive index of the obtained PZT film was 2.50 when measured at this time. A Pt upper electrode (200 nm) was formed on the obtained PZT film by sputtering. When electrical properties of the PZT film were measured, a dielectric constant at 0 V was 1430, and it was able to be confirmed that the PZT film had a high dielectric constant. In addition, when observed using a SEM, the PZT film had a thickness of 280 nm and a dense columnar structure, and cracking did not occur.

Example 3

1.64 g of PVP (k=30) was added to 50 g of the PZT sol-gel solution in which 25 wt % of PZT as an oxide was dissolved in an ethanol solvent such that PZT:PVP=1:0.45, followed by stirring for 2 hours and stabilization in a refrigerator (5° C.) for 24 hours. N-methyl was added to the above-obtained solution such that the amount thereof in the solution was 3.0 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.40 when measured at 632.8 nm. This substrate was baked by being heated to 700° C. at a temperature increase rate of 10° C./sec and being held at 700° C. for 1 minute in RTA. The refractive index of the obtained PZT film was 2.50 when measured at this time. A Pt upper electrode (200 nm) was formed on the obtained PZT film by sputtering. When electrical properties of the PZT film were measured, a dielectric constant at 0 V was 1430, and it was able to be confirmed that the PZT film had a sufficiently high dielectric constant. In addition, when observed using a SEM, the PZT film had a thickness of 350 nm and a dense structure, and cracking did not occur.

Example 4

1.64 g of PVP (k=30) was added to 50 g of the PZT sol-gel solution in which 25 wt % of PZT as an oxide was dissolved in an ethanol solvent such that PZT:PVP=1:0.45, followed by stirring for 2 hours and stabilization in a refrigerator (5° C.) for 24 hours. N-methyl pyrrolidone was added to the above-obtained solution such that the amount thereof in the solution was 6.5 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.41 when measured at 632.8 nm. This substrate was baked by being heated to 700° C. at a temperature increase rate of 10° C./sec and being held at 700° C. for 1 minute in RTA. The refractive index of the obtained PZT film was 2.51 when measured at this time. A Pt upper electrode (200 nm) was formed on the obtained PZT film by sputtering. When electrical properties of the PZT film were measured, a dielectric constant at 0 V was 1450, and it was able to be confirmed that the PZT film had a sufficiently high dielectric constant. In addition, when observed using a SEM, the PZT film had as thickness of 320 nm and a significantly dense structure, and cracking did not occur.

Example 5

1.64 g of PVP (k=30) was added to 50 g of the PZT sol-gel solution in which 25 wt % of PZT as an oxide was dissolved in an ethanol solvent such that PZT:PVP=1:0.45, followed by stirring for 2 hours and stabilization in a refrigerator (5° C.) for 24 hours. N-methyl pyrrolidone was added to the above-obtained solution such that the amount thereof in the solution was 13.0 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.42 when measured at 632.8 nm. This substrate was baked by being heated to 700° C. at a temperature increase rate of 10° C./sec and being held at 700° C. for 1 minute in RTA. The refractive index of the obtained PZT film was 2.50 when measured at this time. A Pt upper electrode (200 nm) was formed on the obtained PZT film by sputtering. When electrical properties of the PZT film were measured, a dielectric constant at 0 V was 1500, and it was able to be confirmed that the PZT film had a sufficiently high dielectric constant. In addition, when observed using a SEM, the PZT film had a thickness of 300 nm and a dense structure, and cracking did not occur.

Example 6

1.82 g of PVP (k=30) was added to 50 g of the PZT sol-gel solution in which 25 wt % of PZT as an oxide was dissolved in an ethanol solvent such that PZT:PVP=1:0.5, followed by stirring for 2 hours and stabilization in a refrigerator (5° C.) for 24 hours. N-methyl pyrrolidone was added to the above-obtained solution such that the amount thereof in the solution was 6.5 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.38 when measured at 632.8 nm. This substrate was baked by being heated to 700° C. at a temperature increase rate of 10° C./sec and being held at 700° C. for 1 minute in RTA. The refractive index of the obtained PZT film was 2.47 when measured at this time. A Pt upper electrode (200 nm) was formed on the obtained PZT film by sputtering. When electrical properties of the PZT film were measured, a dielectric constant at 0 V was 1400, and it was able to be confirmed that the PZT film had a high dielectric constant. In addition, when observed using a SEM, the PZT film had a thickness of 360 nm and a dense structure, and cracking did not occur.

Comparative Example 1

0.18 g of PVP (k=30) was added to 50 g of the PZT sol-gel solution in which 25 wt % of PZT as an oxide was dissolved in an ethanol solvent such that PZT:PVP=1:0.05, followed by stirring for 2 hours and stabilization in a refrigerator (5° C.) for 24 hours. N-methyl pyrrolidone was added to the above-obtained solution such that the amount thereof in the solution was 6.5 mass %, followed by stirring for 2 hours. The obtained solution was added dropwise to the Pt film, followed by spin coating for 60 seconds at 2000 rpm. This substrate was held on a hot plate at 150° C. for 3 minutes to remove the residual solvent, water, and the like in the film. The obtained substrate was pre-baked by rapid thermal annealing (RTA). For pre-baking, the substrate was heated to The refractive index of the obtained PZT film was 2.40 when measured at 632.8 nm. This substrate was baked by being heated to 100° C. at a temperature increase rate of 10° C./sec and being held at 700° C. for 1 minute in RTA. The refractive index of the obtained PZT film was 2.51 when measured at this time. A Pt upper electrode (200 nm) was formed on the obtained PZT film by sputtering. When electrical properties of the PZT film were measured, a dielectric constant at 0 V was 1200. In addition, when observed using a SEM, the PZT film had a thickness of 190 nm, and cracking occurred in the PZT film.

Comparative Example 2

2.73 g of PVP (k=30) was added to 50 g of the PZT sol-gel solution in which 25 wt % of PZT as an oxide was dissolved in an ethanol solvent such that PZT:PVP=1:0.75, followed by stirring for 2 hours and stabilization in a refrigerator (5° C.) for 24 hours. N-methyl pyrrolidone was added to the above-obtained solution such that the amount thereof in the solution was 6.5 mass %, followed by stirring for 2 hours. The obtained solution was added dropwise to the Pt film, followed by spin coating for 60 seconds at 2000 rpm. In this case, the viscosity of the solution was excessively high, and thus it was difficult to perform uniform coating. This substrate was held on a hot plate at 150° C. for 3 minutes to remove the residual solvent, water, and the like in the film. The obtained substrate was pre-baked by rapid thermal annealing (RTA). For pre-baking, the substrate was heated to 275° C. at 2.5° C./sec and held at 275° C. for 3 minutes, and was heated to 460° C. at 10° C./sec and held at 460° C. for 8 minutes.

The refractive index of the obtained PZT film was 2.05 when measured at 632.8 nm. This substrate was baked by being heated to 700° C. at a temperature increase rate of 10° C./sec and being held at 700° C. for 1 minute in RTA. The refractive index of the obtained PZT film was 2.21 when measured at this time. A Pt upper electrode (200 nm) was firmed on the obtained PZT film by sputtering. When electrical properties of the PZT film were measured, a dielectric constant at 0 V was 850. In addition, when observed using a SEM, the PZT film had a thickness of 470 nm, and cracking occurred in the PZT film.

Comprehensive Evaluation

As can be seen from above, all the PZT films of Examples 1 to 6 according to the invention were superior in refractive index to the PZT films of Comparative Examples 1 and 2. In addition, the PZT films of Examples according to the invention had a dense structure, and cracking did not occur. On the other hand, the PZT films of Comparative Examples did not have a dense structure, and cracking occurred. It was found from above results that, by using the ferroelectric thin film-forming sol-gel solution according to the invention as a raw material of a PZT film, a PZT film having a crack-free and dense structure and practically sufficient properties can be prepared.

TABLE 1

| | Ratio of PVP Added (to PZT) | Amount (mass %) of N-Methyl Pyrrolidone Added | Refractive Index | Thickness (nm) after Baking | Cracking | Dielectric Constant at 0 (V) |
|---|---|---|---|---|---|---|
| Example 1 | 0.20 | 6.5 | 2.52 | 250 | Not Occurred | 1500 |
| Example 2 | 0.25 | 3.0 | 2.50 | 280 | Not Occurred | 1430 |
| Example 3 | 0.45 | 3.0 | 2.50 | 350 | Not Occurred | 1430 |
| Example 4 | 0.45 | 6.5 | 2.51 | 320 | Not Occurred | 1450 |
| Example 5 | 0.45 | 13.0 | 2.50 | 300 | Not Occurred | 1500 |
| Example 6 | 0.50 | 6.5 | 2.47 | 360 | Not Occurred | 1400 |
| Comparative Example 1 | 0.05 | 6.5 | 2.51 | 190 | Occurred | 1200 |
| Comparative Example 2 | 0.75 | 6.5 | 2.21 | 470 | Occurred | 850 |

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The ferroelectric thin film-forming sol-gel solution according to the invention can be used as a precursor solution fix manufacturing an electric device or electric component containing a ferroelectric material, such as a thin-film piezoelectric device or a thin film capacitor, which requires a relatively thick ferroelectric thin film.

What is claimed is:
1. A ferroelectric thin film-forming sol-gel solution comprising:
   a PZT-based compound;
   a high-molecular compound used to adjust a viscosity containing polyvinyl pyrrolidone; and
   an organic dopant containing N-methyl pyrrolidone,
   wherein an amount of the PZT-based compound is greater than or equal to 17 mass % in terms of oxides, a molar ratio of the PZT-based compound:the polyvinyl pyrrolidone is 1:0.1 to 1:0.5 in terms of monomers, and an amount of the N-methyl pyrrolidone is 3 mass % to 13 mass % in the sol-gel solution.

2. The ferroelectric thin film-forming sol-gel solution according to claim 1, wherein a k value of the polyvinyl pyrrolidone is in a range of 15 to 90.

3. A method of forming a ferroelectric thin film using the ferroelectric thin film-forming sol-gel solution according to claim 1.

4. A method of forming a ferroelectric thin film using the ferroelectric thin film-forming sol-gel solution according to claim 2.

* * * * *